(12) United States Patent
Miura et al.

(10) Patent No.: US 9,765,749 B2
(45) Date of Patent: Sep. 19, 2017

(54) DEVICE

(71) Applicant: FUJI ELECTRIC CO., LTD., Kanagawa (JP)

(72) Inventors: Hideki Miura, Matsumoto (JP); Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/216,704

(22) Filed: Jul. 22, 2016

(65) Prior Publication Data

US 2017/0077922 A1 Mar. 16, 2017

(30) Foreign Application Priority Data

Sep. 16, 2015 (JP) ................. 2015-182867

(51) Int. Cl.
| | |
|---|---|
| *H03B 1/00* | (2006.01) |
| *H03K 3/00* | (2006.01) |
| *F02P 3/05* | (2006.01) |
| *H02M 3/07* | (2006.01) |
| *H03K 17/06* | (2006.01) |
| *H03K 17/687* | (2006.01) |

(52) U.S. Cl.
CPC ............. *F02P 3/051* (2013.01); *H02M 3/07* (2013.01); *H03K 17/06* (2013.01); *H03K 17/6877* (2013.01); *H03K 2217/0063* (2013.01); *H03K 2217/0081* (2013.01)

(58) Field of Classification Search
CPC ... H03K 17/567; H03K 17/6872; H02M 3/07; F02P 3/051
USPC ................ 327/108–112, 427, 434, 437, 333; 326/82, 83, 87; 123/651, 652, 644, 630
See application file for complete search history.

(56) References Cited

U.S. PATENT DOCUMENTS

| | | | | |
|---|---|---|---|---|
| 4,692,638 | A | * 9/1987 | Stiegler .................... | G11C 8/10 326/108 |
| 5,559,452 | A | * 9/1996 | Saito ................ | H03K 19/01707 326/27 |
| 6,269,011 | B1 | 7/2001 | Ohshima | |
| 2001/0037801 | A1 * | 11/2001 | Ito ............................. | F02P 3/04 123/644 |
| 2002/0021150 | A1 | 2/2002 | Tuchiya et al. | |
| 2014/0300413 | A1 | 10/2014 | Höyerby et al. | |

* cited by examiner

*Primary Examiner* — Thomas Skibinski

(57) ABSTRACT

A one-chip igniter is formed by a convenient manufacturing process and at a low cost. A device to switch a power semiconductor switch is provided, the device comprising a first semiconductor switch which is turned on or turned off in response to a first control signal input to a gate and, if turned on, provides a high voltage to a gate of the power semiconductor switch, and a voltage boosting circuit which boosts a voltage of the first control signal that turns the first semiconductor switch on. As one example, the voltage boosting circuit boosts a voltage of the first control signal which turns the first semiconductor switch on to a higher voltage than a high voltage.

18 Claims, 8 Drawing Sheets

DEVICE

The contents of the following Japanese patent application are incorporated herein by reference:
NO. 2015-182867 filed on Sep. 16, 2015.

BACKGROUND

1. Technical Field

The present invention relates to a device.

2. Related Art

Conventionally, a semiconductor device used for ignition of an internal combustion engine and the like has been formed as a one-chip igniter by integrating a power semiconductor device which handles a large power with an integrated circuit of a CMOS (Complementary Metal Oxide Semiconductor) circuit (for example, refer to Patent Documents 1 to 3).

Patent Document 1: Japanese Patent Application Publication No. 2002-9602

Patent Document 2: Japanese Patent Application Publication No. 2000-299927

Patent Document 3: Japanese Unexamined Patent Application Publication No. 2014-522612

However, when forming such a one-chip igniter, different types of transistor elements such as an N channel MOS FET (Field Effect Transistor) and a P channel MOS FET on a semiconductor substrate are to be performed, a manufacturing process has become complicated and also, the cost has been increased. Therefore, it has been desired to form a one-chip igniter by a convenient manufacturing process and at a low cost.

SUMMARY

Accordingly, in one aspect of a technical innovation included in the present specification, a purpose is to provide a device which can solve the above-described problem. This purpose can be achieved by a combination of features described in claims. That is, in a first embodiment of the present invention, a device to switch a power semiconductor switch is provided, the device comprising a first semiconductor switch which is turned on or turned off in response to a first control signal input to a gate and, if turned on, provides a high voltage to a gate of the power semiconductor switch, and a voltage boosting circuit which boosts a voltage of the first control signal that turns the first semiconductor switch on.

It should be noted that the above-described invention summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments for the invention do not limit the invention according to the claims, and all the combinations of the features described in the embodiments are not necessarily essential to solving means provided by aspects of the invention.

Figure 1:
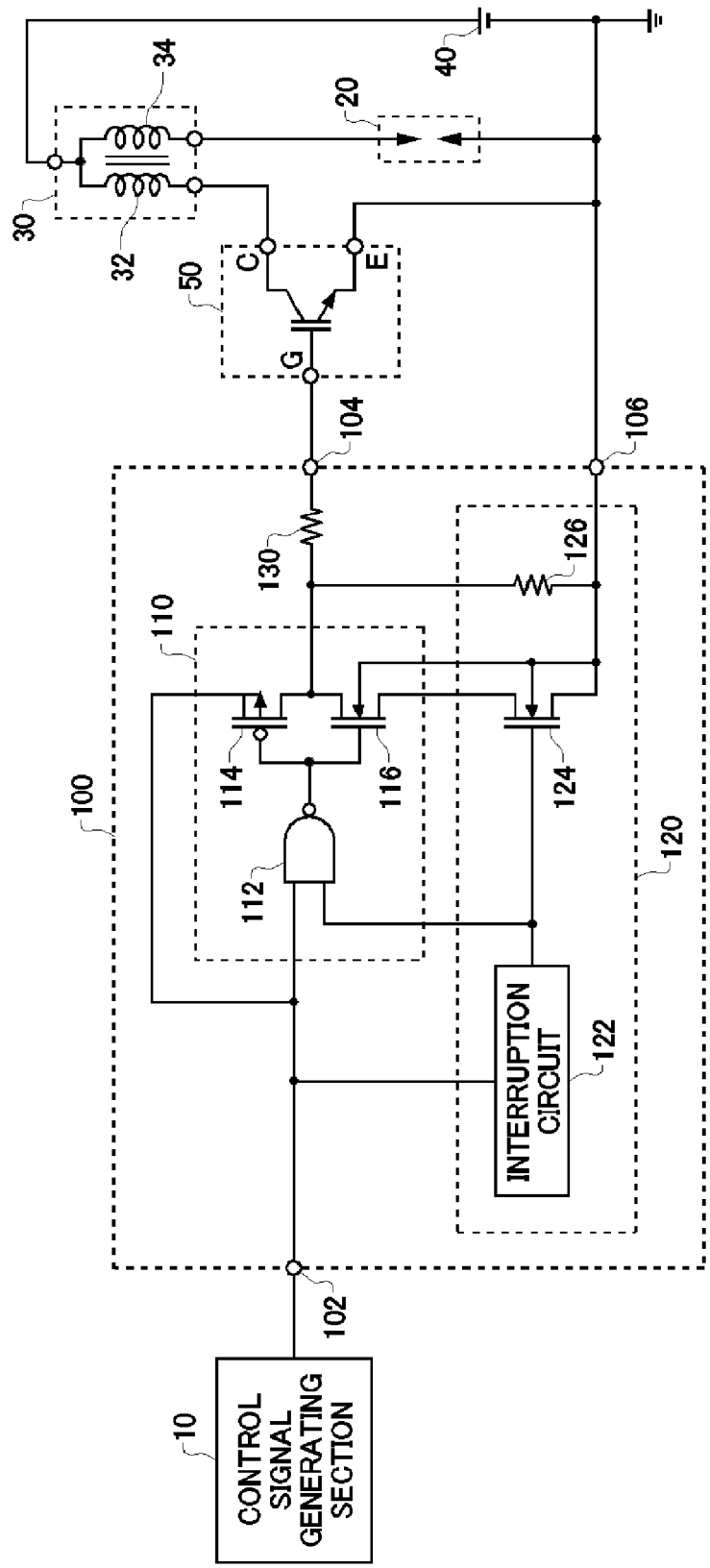
FIG. 1 shows a configurational example of an ignition device 1000 according to the present embodiment.

FIG. 1 shows a configurational example of the ignition device 1000 according to the present embodiment. The ignition device 1000 ignites an ignition plug used in such as an internal combustion engine of an automobile and the like. In the present embodiment, an example of the ignition device 1000 equipped on an engine of an automobile will be described. The ignition device 1000 comprises a control signal generating section 10, an ignition plug 20, an ignition coil 30, a power source 40, a power semiconductor switch 50 and a device 100.

The control signal generating section 10 generates and supplies to the device 100 a switching control signal that controls an ON/OFF switching of the power semiconductor switch 50. The control signal generating section 10 is, for example, one part of or the whole engine control unit (ECU) of an automobile where the ignition device 1000 is equipped. The control signal generating section 10 supplies the switching control signal to the device 100; thereby, the ignition device 1000 starts an igniting operation of the ignition plug 20.

The ignition plug 20 electrically generates sparks by discharge. The ignition plug 20 may be arranged in the internal combustion engine; in this case, the ignition plug 20 ignites a combustion gas such as a mixed gas in a combustion chamber. For example, the ignition plug 20 is arranged in a through hole which penetrates from the outside of the cylinder to a combustion chamber inside a cylinder and is fixed so as to seal the through hole. In this case, one end of the ignition plug 20 is exposed to the inside of the combustion chamber and the other end receives an electrical signal from the outside of the cylinder.

The ignition coil 30 supplies the electrical signal to the ignition plug. The ignition coil 30 supplies a high voltage that discharges the ignition plug 20 as the electrical signal. The ignition coil 30 may function as a transformer, for example, being an ignition coil having a primary coil 32 and a secondary coil 34. The primary coil 32 and the secondary coil 34 are electrically connected to each other by one end of the primary coil 32 and one end of the secondary coil 34. The primary coil 32 has the number of turns of winding not greater than that of the secondary coil 34, and shares a core with the secondary coil 34. The secondary coil 34 generates an electromotive force (a mutual induced electromotive force) in response to an electromotive force generated at the primary coil 32. The secondary coil 34 is connected to the ignition plug 20 at the other end and supplies the generated electromotive force to the ignition plug 20 to discharge the ignition plug 20.

The power source 40 supplies a voltage to the ignition coil 30. For example, the power source 40 supplies a predetermined constant voltage to one end of the primary coil 32 and one end of the secondary coil 34.

The power semiconductor switch 50 switches between conduction and non-conduction between the other end of the primary coil 32 of the ignition coil 30 and a reference potential, and generates an electromotive force (a self-induced electromotive force) to the primary coil 32. For example, the power semiconductor switch 50 electrically connects the primary coil 32 and the reference potential in response to an ON voltage provided from the device 100 and makes non-conduction between the primary coil 32 and the reference potential in response to an OFF voltage provided from the device 100. As one example, the power semiconductor switch 50 is an insulated gate bipolar transistor (IGBT). In this case, the device 100 is to provide a gate voltage to the power semiconductor switch 50.

The device 100 switches the power semiconductor switch 50 on or off. The device 100 has an input terminal 102, an output terminal 104, a reference potential terminal 106, a drive circuit 110, a diagnosis circuit 120 and a resistor 130. The input terminal 102 is connected to the control signal generating section 10, the output terminal 104 is connected to the power semiconductor switch 50, and the reference potential terminal 106 is connected to the reference potential. Here, the reference potential may be a reference potential in a control system of an automobile, or may be a reference potential corresponding to the device 100 within the automobile. The reference potential may also be a low voltage that turns the power semiconductor switch 50 off, and, as one example, is 0V.

The drive circuit 110 provides either an ON voltage or an OFF voltage to the power semiconductor switch 50. For example, the drive circuit 110 supplies the ON voltage to the power semiconductor switch 50 in response to the high voltage of the switching control signal input from the control signal generating section 10. Also, the drive circuit 110 provides the OFF voltage to the power semiconductor switch 50 in response to the low voltage of the switching control signal. Also, the drive circuit 110 may provide the OFF voltage to the power semiconductor switch 50 in response to the OFF voltage received from the diagnosis circuit 120. The drive circuit 110 includes an NAND circuit 112, a first semiconductor switch 114 and a second semiconductor switch 116.

The NAND circuit 112 executes NAND to output the low voltage when two input signals are at the high voltage and to output the high voltage when at least one of the two input signals is at the low voltage. FIG. 1 shows an example that the NAND circuit 112 inputs the switching control signal input from the input terminal 102 as one input signal and inputs an output signal of the diagnosis circuit 120 as the other input signal. The NAND circuit 112 supplies the output signals corresponding to the two input signals as control signals for the first semiconductor switch 114 and the second semiconductor switch 116.

The first semiconductor switch 114 switches between being electrically connect or not between the input terminal 102 and the output terminal 104 in response to the control signals received from the NAND circuit 112. FIG. 1 shows an example that the first semiconductor switch 114 is configured with a PMOS transistor which forms a P type channel (a majority carrier, that is, a hole). In this case, the first semiconductor switch 114 has a collector terminal connected to the input terminal 102 and an emitter terminal connected to the output terminal 104 via the resistor 130, and electrically connects (disconnects) the input terminal 102 and the output terminal 104 in response to a low voltage (a high voltage) input to the gate.

The second semiconductor switch 116 is switched ON or OFF in response to the control signal received from the NAND circuit 112. FIG. 1 shows an example that the second semiconductor switch 116 is configured with an NMOS transistor which forms an N type channel (that is, an electron). In this case, the second semiconductor switch 116 has a collector terminal connected to the emitter terminal of the first semiconductor switch 114 and an emitter terminal connected to the reference potential terminal 106 via the diagnosis circuit 120, and electrically disconnects (connects) between the emitter terminal of the first semiconductor switch 114 and the reference potential terminal 106 in response to a low voltage (a high voltage) input to the gate.

That is, the second semiconductor switch 116 is turned on or turned off in response to the control signal input to the gate and is turned off (on) if the first semiconductor switch 114 is turned on (off). In this way, in response to a condition that the control signal is at the high voltage, the first semiconductor switch 114 is switched on and the second semiconductor switch 116 is switched off respectively, and the drive circuit 110 provides the high voltage of the switching control signal to the gate of the power semiconductor switch 50. Also, in response to a condition that the control signal is at the low voltage, the first semiconductor switch 114 is switched off and, also, the second semiconductor switch 116 is switched on respectively, and the drive circuit 110 provides the low voltage of the reference potential to the gate of the power semiconductor switch 50.

The diagnosis circuit 120 diagnoses the switching control signal input to the input terminal 102 and turns the power semiconductor switch 50 off in response to a condition that the diagnosis result is abnormal. Also, when turning the power semiconductor switch 50 off, the diagnosis circuit 120 gradually decreases a collector current of the power semiconductor switch 50 to the extent without generating at the secondary coil 34 any electromotive force that discharges the ignition plug 20. The diagnosis circuit 120 includes an interruption circuit 122, a third semiconductor switch 124 and a resistor 126.

The interruption circuit 122 detects a continuation period of time of a high voltage of the switching control signal, and when the high voltage is switched to an OFF voltage in the continuation period of time which is not greater than a reference period of time or a predetermined period of time, the interruption circuit 122 diagnoses that the switching control signal is normal and continues the operation of the drive circuit 110. For example, when the diagnosis result of the interruption circuit 122 is normal, the interrupting circuit 122 provides the high voltage as the other input signal of the NAND circuit 112. Accordingly, when the switching control signal being one input signal is at the high voltage (the low voltage, the NAND circuit 112 outputs the low voltage (the high voltage). That is, when the switching control signal is diagnosed with normality, the interruption circuit 122 makes the drive circuit 110 execute an operation of turning the power semiconductor switch 50 on or off in response to the switching control signal.

Also, the interruption circuit 122 detects the continuation period of time of the high voltage of the switching control signal and diagnoses that the switching control signal is abnormal in response to a condition that the high voltage continues for a period of time exceeding the reference period of time or the predetermined period of time. For example, when the diagnosis result of the interruption circuit 122 is abnormal, the interrupting circuit 122 provides the low voltage as the other input signal of the NAND circuit 112. Accordingly, since the NAND circuit 112 outputs the high voltage even if the switching control signal being one input signal is at either the high voltage or the low voltage, the interruption circuit 122 can turn the power semiconductor switch 50 off. Also, the interruption circuit 122 provides to the third semiconductor switch 124 the high voltage and the low voltage corresponding to the diagnosis result. It should be noted that the interruption circuit 122 includes an NOT circuit at a final stage, as one example.

The third semiconductor switch 124 is switched on or off in response to the ON voltage and the OFF voltage received from the interruption circuit 122. FIG. 1 shows an example that the third semiconductor switch 124 is configured with an NMOS transistor. In this case, the third semiconductor switch 124 has a collector terminal connected to the emitter terminal of the second semiconductor switch 116 and an emitter terminal connected to the reference potential terminal 106, and electrically disconnects (connects) the emitter terminal of the second semiconductor switch 116 and the reference potential terminal 106 in response to the low voltage (the high voltage) input to the gate.

That is, when the diagnosis result of the interruption circuit 122 is normal, the third semiconductor switch 124 receives the high voltage from the interrupting circuit 122 and electrically connects the emitter terminal of the second semiconductor switch 116 and the reference potential terminal 106. Accordingly, when the diagnosis result is normal, the third semiconductor switch 124 makes the drive circuit 110 execute the operation corresponding to the switching control signal.

Also, when the diagnosis result of the interruption circuit 122 is abnormal, the third semiconductor switch 124 receives the low voltage from the interrupting circuit 122 and electrically disconnects the emitter terminal of the second semiconductor switch 116 and the reference potential terminal 106. Accordingly, even if the interruption circuit 122 turns the power semiconductor switch 50 off in response to a condition that the diagnosis result is abnormal, the third semiconductor switch 124 prevents the charges of the gate of the power semiconductor switch 50 from directly passing toward the reference potential via the second semiconductor switch 116.

The resistor 126 is connected to the output terminal 104 at one end via the resistor 130 and is connected to the reference potential terminal 106 at the other end. That is, when the interruption circuit 122 turns the power semiconductor switch 50 off, the resistor 126 makes the charges accumulated in the gate of the power semiconductor switch 50 flow toward the reference potential via the resistor 130. Here, the charges accumulated in the gate of the power semiconductor switch 50 flow toward the reference potential with a time constant which is determined by a gate capacity of the power semiconductor switch 50 and the resistor 126 and the resistor 130.

It should be noted that if the charges suddenly flow, an electromotive force is generated at the secondary coil 34 to discharge the ignition plug 20; therefore, the resistor 126 has a resistor value equal to or higher than a predetermined value and makes the charges flow gradually with a time constant to the extent that prevents the ignition plug 20 from discharging. In this way, the resistor 126 makes the charges accumulated in the gate of the power semiconductor switch 50 flow gradually toward the reference potential to gradually transit the power semiconductor switch 50 to the OFF state.

The resistor 130 is connected to the emitter terminal of the first semiconductor switch 114 at one end and is connected to the output terminal 104 at the other end. The resistor 130 has a lower resistor value than that of the resistor 126. The resistor 130 provides the ON voltage from the first semiconductor switch 114 to the gate of the power semiconductor switch 50 when transiting the power semiconductor switch 50 to the ON state.

Also, when transiting the power semiconductor switch 50 to the OFF state, the resistor 30 makes the charges accumulated in the gate of the power semiconductor switch 50 flow toward the reference potential. When the second semiconductor switch 116 and the third semiconductor switch 124 are in the ON state, the resistor 130 makes the charges flow immediately toward the reference potential and generates at the secondary coil 34 the electromotive force that discharges the ignition plug 20. Also, when the second semiconductor switch 116 and the third semiconductor switch 124 are in the OFF state, the resistor 130 makes the charges flow toward the reference potential via the resistor 126.

The device 100 according to the present embodiment above provides either an ON voltage or an OFF voltage appropriate for the power semiconductor switch 50 from the output terminal 104 to the power semiconductor switch 50 in response to the switching control signal input from the input terminal 102. Operations of the ignition device 1000 comprising such a device 100 will be described next.

Figure 2:
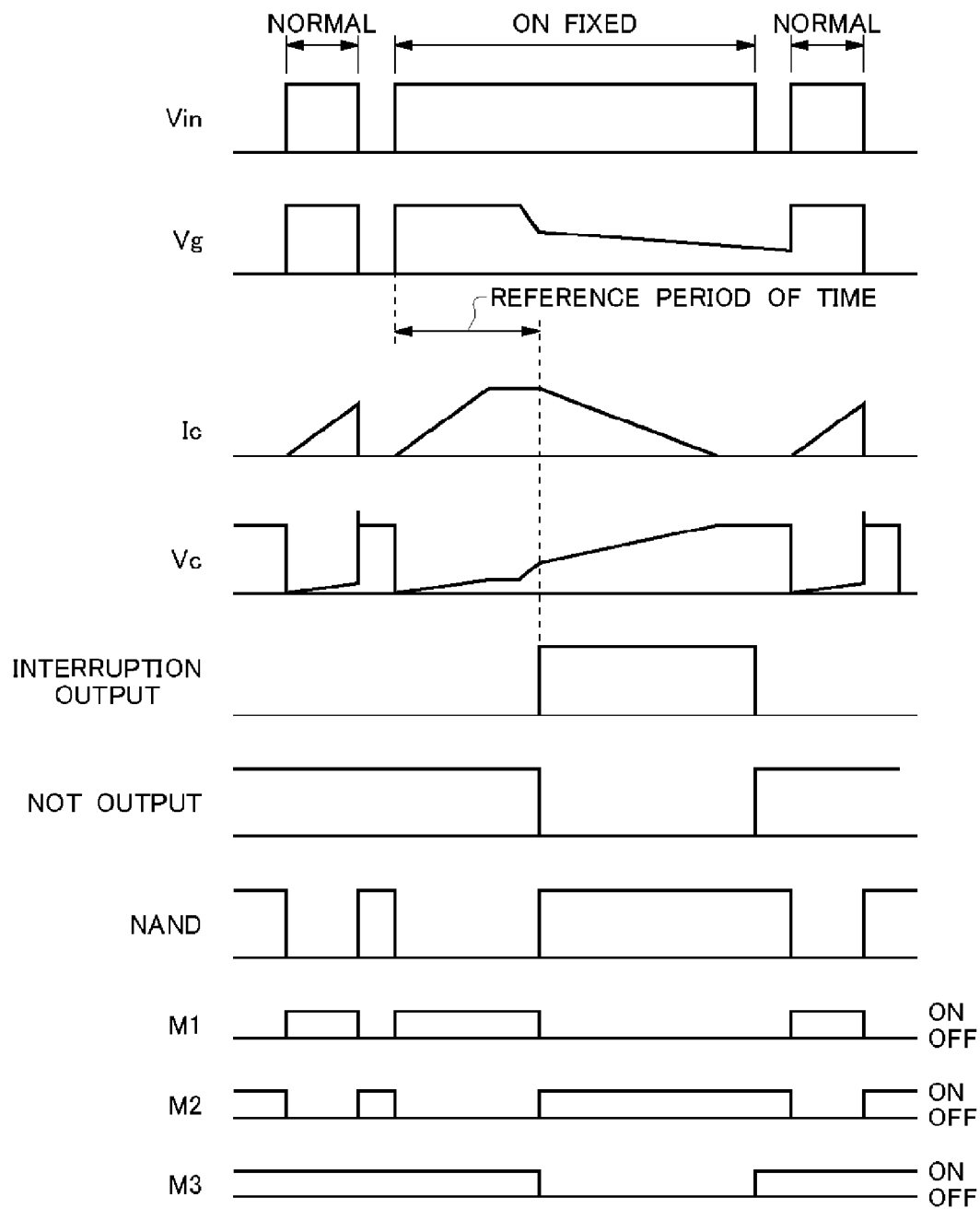
FIG. 2 shows one example of operation waveforms of the ignition device 1000 according to the present embodiment.

FIG. 2 shows one example of operation waveforms of the ignition device 1000 according to the present embodiment. In FIG. 2, a horizontal axis indicates a period of time and a longitudinal axis indicates a voltage value or a current value. In FIG. 2, a waveform indicated as Vin shows the switching control signal output by the control signal generating section 10. FIG. 2 shows an example that the switching control signal Vin has two normal operation waveforms indicated as "normal" and has an abnormal operation waveform indicated as "ON fixed" between the two normal operation waveforms.

Also, FIG. 2 shows one example of time waveforms of a gate voltage indicated as Vg, a collector current indicated as Ic and a collector voltage indicated as Vc, of the power semiconductor switch 50 respectively. Also, FIG. 2 shows one example of time waveforms of an input voltage of an NOT circuit indicated as "interruption output" and an output voltage of the NOT circuit indicated as "NOT output" respectively, when the interruption circuit 122 includes the NOT circuit (an inverter circuit) at an output stage. Also, FIG. 2 shows one example of time waveforms of an output voltage of the NAND circuit 112 indicated as NAND, ON and OFF states of the first semiconductor switch 114 indicated as M1, ON and OFF states of the second semiconductor switch 116 indicated as M2, and ON and OFF states of the third semiconductor switch 124 indicated as M3 respectively.

When the switching control signal Vin turns to the high voltage and is in a range of normal operation, the output (NOT output) of the interruption circuit 122 is at the high voltage and the third semiconductor switch 124 receiving the high voltage turns to the ON state. Also, the NAND circuit 112 that receives the high voltage of the switching control signal Vin and the high voltage of the interruption circuit 122 outputs the low voltage. Also, by the low voltage of the NAND circuit 112, the first semiconductor switch 114 turns to the ON state and the second semiconductor switch 116 turns to the OFF state.

Accordingly, the ON voltage is provided to the gate of the power semiconductor switch 50 and the collector current Ic flows from the power source 40 via the primary coil 32 of the ignition coil 30. It should be noted that a time change dIc/dt of the collector current Ic is determined in response to an inductance of the primary coil 32 and the providing voltage of the power source 40 and is increased to a predetermined (or preset) current value. For example, the collector current Ic is increased approximately to several A, a dozen of A or several tens of A.

Then, if the switching control signal Vin turns to the low voltage, the NAND circuit 112 outputs the high voltage. By the high voltage of the NAND circuit 112, the first semiconductor switch 114 turns to the OFF state and the second semiconductor switch 116 turns to the ON state. That is, the gate of the power semiconductor switch 50 is provided with the OFF voltage, and the charges accumulated in the gate of the power semiconductor switch 50 flow to the reference potential via the second semiconductor switch 116 and the third semiconductor switch 124; thereby, the collector current Ic is drastically decreased.

By the drastic decrease of the collector current Ic, a both-end voltage of the primary coil 32 is drastically increased by a self-induced electromotive force, and generates an induced electromotive force of about several tens of kV at a both-end voltage of the secondary coil 34. The ignition device 1000 discharges the ignition plug 20 to ignite the combustion gas by providing such a voltage of the secondary coil 34 to the ignition plug 20. As the above, the device 100 according to the present embodiment can provide an appropriate ON voltage and OFF voltage to the power semiconductor switch 50 in response to the switching control signal input from the input terminal 102, and the ignition device 1000 can execute the igniting operation of the ignition plug 20 by the switching control signal diagnosed with the normal operation.

On the other hand, if the switching control signal Vin does not switch to the low voltage and the high voltage is continued, the ON voltage is continuously provided to the gate of the power semiconductor switch 50 and the collector current Ic is further increased. Depending on the power semiconductor switch 50, the collector current Ic is increased to a saturated region in some cases. The operation waveforms of FIG. 2 show an example that the saturation occurred. Then, if the high voltage of the switching control signal Vin continues for a period of time exceeding the reference period of time, the interruption circuit 122 diagnoses that the switching control signal is abnormal and outputs the low voltage (NOT output).

Accordingly, the NAND circuit 112 that receives the high voltage of the switching control signal Vin and the low voltage of the interruption circuit 122 outputs the high voltage. By the high voltage of the NAND circuit 112, the first semiconductor switch 114 turns to the OFF state and the second semiconductor switch 116 turns to the ON state. Also, the third semiconductor switch 124 that receives the low voltage of the interruption circuit 122 turns to the OFF state. That is, the OFF voltage is provided to the gate of the power semiconductor switch 50 and the charges accumulated in the gate of the power semiconductor switch 50 flow to the reference potential via the resistor 130 and the resistor 126; thereby, the collector current Ic is gradually decreased.

Therefore, when the switching control signal is diagnosed with the abnormality, the device 100 according to the present embodiment can gradually decrease the collector current Ic to prevent the ignition plug 20 from discharging even if the collector current Ic is increased to the extent of saturation. That is, the device 100 can provide an appropriate ON voltage and OFF voltage to the power semiconductor switch 50 in response to the switching control signal input from the input terminal 102, and the ignition device 1000 can stop the igniting operation of the ignition plug 20 by the switching control signal diagnosed with the abnormal operation.

As the above, an example has been described that the device 100 according to the present embodiment described has the first semiconductor switch 114 which is the PMOS transistor and the second semiconductor switch 116 and the third semiconductor switch 124 which are the NMOS transistors. Alternatively, the device 100 operates in principle even if having the first semiconductor switch 114 which is the NMOS transistor and the second semiconductor switch 116 and the third semiconductor switch 124 which are the PMOS transistors.

However, in any of the configurations, since the different types of transistors are included, in a case where the device 100 is to be made as one chip, the manufacturing process becomes complicated and the cost becomes increased. Also, for example, in the device 100, if using a plurality of transistors of the same type only, the ON voltage is decreased by the threshold voltages of the transistors and it becomes difficult to provide an appropriate ON voltage to the power semiconductor switch 50.

Accordingly, a device 200 according to the present embodiment executes the similar operation to the operation of the device 100 described in FIG. 1 and FIG. 2 by having a voltage boosting circuit and a plurality of transistors of the same type. An ignition device 2000 comprising such a device 200 will be described by using FIG. 3.

Figure 3:
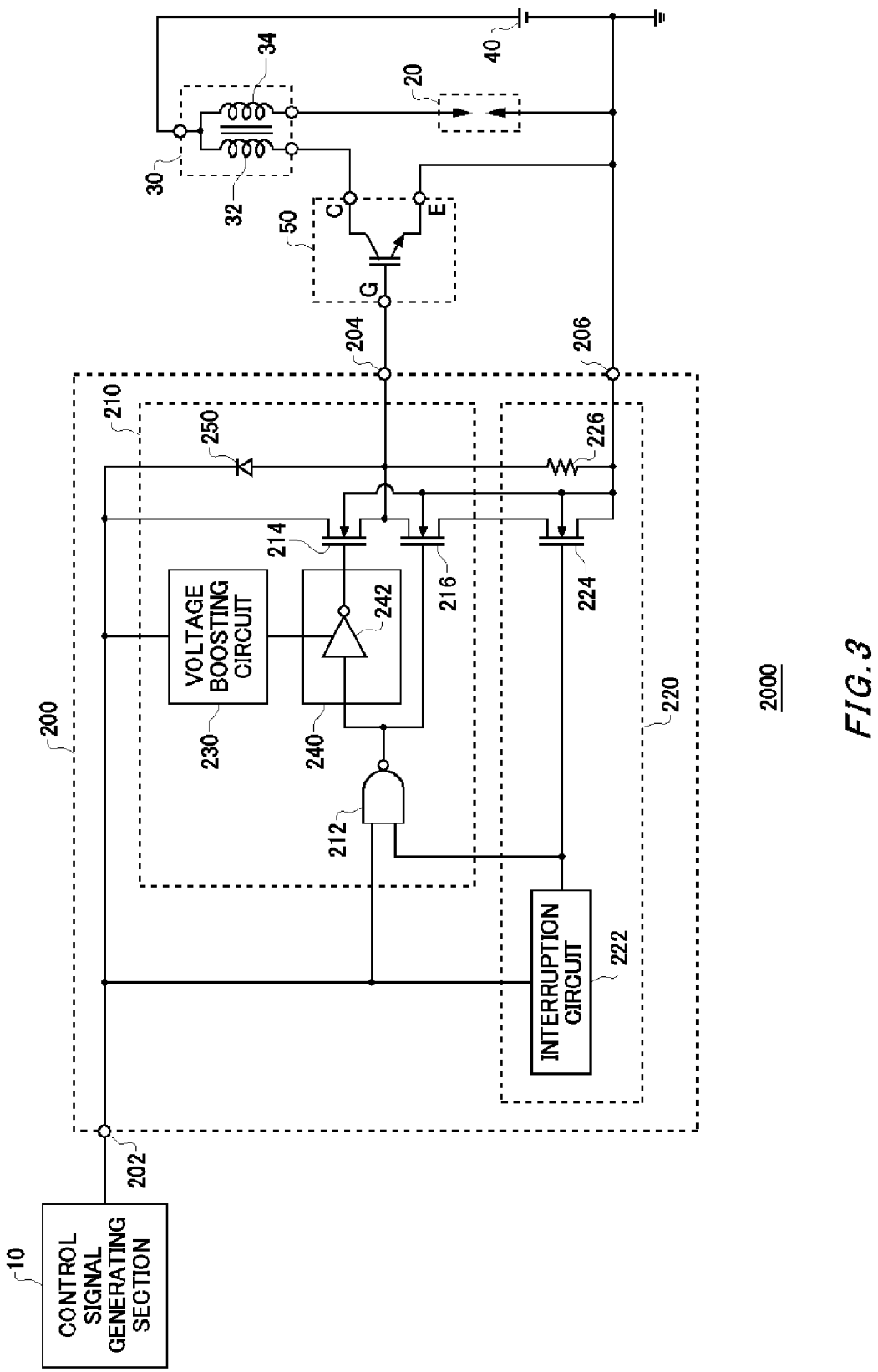
FIG. 3 shows a configurational example of an ignition device 2000 according to the present embodiment.

FIG. 3 shows a configurational example of the ignition device 2000 according to the present embodiment. In the ignition device 2000 shown in FIG. 3, the same reference signs are given to approximately the same operations as that of the ignition device 1000 according to the present embodiment shown in FIG. 1 and the description is omitted. The ignition device 2000 comprises a control signal generating section 10, an ignition plug 20, an ignition coil 30, a power source 40, a power semiconductor switch 50 and a device 200. It should be noted that the descriptions for the control signal generating section 10, the ignition plug 20, the ignition coil 30, the power source 40 and the power semiconductor switch 50 are omitted.

The device 200 switches the power semiconductor switch 50 on or off. The device 200 has an input terminal 202, an output terminal 204, a reference potential terminal 206, a drive circuit 210 and a diagnosis circuit 220. The input terminal 202 is connected to the control signal generating section 10, the output terminal 204 is connected to the power semiconductor switch 50, and the reference potential terminal 206 is connected to the reference potential.

The drive circuit 210 provides either an ON voltage or an OFF voltage to the power semiconductor switch 50. For example, the drive circuit 210 provides the ON voltage to the power semiconductor switch 50 in response to the high voltage of the switching control signal input from the control signal generating section 10. Also, the drive circuit 210 provides the OFF voltage to the power semiconductor switch 50 in response to the low voltage of the switching control signal. Also, the drive circuit 210 may also provide the OFF voltage to the power semiconductor switch 50 in response to the OFF voltage received from the diagnosis circuit 220. The drive circuit 210 includes an NAND circuit 212, a first semiconductor switch 214, a second semiconductor switch 216, a voltage boosting circuit 230, a control circuit 240 and a diode 250.

The NAND circuit 212 executes NAND to output the low voltage when two input signals are at the high voltage and to output the high voltage when at least one of the two input signals is at the L low voltage. FIG. 3 shows an example that the NAND circuit 212 inputs the switching control signal input from the input terminal 202 as one input signal and inputs an output signal of the diagnosis circuit 220 as the other input signal. The NAND circuit 212 supplies the output signals corresponding to the two input signals as the control signals for the first semiconductor switch 214 and the second semiconductor switch 216.

The first semiconductor switch 214 switches between being electrically connect or not between the input terminal 202 and the output terminal 204 in response to the first control signal received from the control circuit 240. Here, the first control signal is the signal resulting from processing by the control circuit 240 the control signal to the first semiconductor switch 214 that the NAND circuit 212 outputs. It should be noted that, as one example, a logical value of the first control signal is a logical value resulting from inverting a logical value of the control signals that the NAND circuit 212 outputs.

FIG. 3 shows an example that the first semiconductor switch 214 is configured with an NMOS transistor (NMOS semiconductor switch). In this case, the first semiconductor switch 214 has a collector terminal connected to the input terminal 202 and an emitter terminal connected to the output terminal 204 and electrically connects (disconnects) the input terminal 202 and the output terminal 204 in response to the high voltage (the low voltage) input to the gate. That is, the first semiconductor switch 214 is turned on or turned off in response to the first control signal input to the gate and, if turned on, provides the high voltage to the gate of the power semiconductor switch 50.

The second semiconductor switch 216 is switched on or off in response to the second control signal received from the NAND circuit 212. Here, the control signal to the second semiconductor switch 216 that the NAND circuit 212 outputs is the second control signal. FIG. 3 shows an example that the second semiconductor switch 216 is configured with an NMOS transistor.

In this case, the second semiconductor switch 216 has a collector terminal connected to the emitter terminal of the first semiconductor switch 214 and an emitter terminal connected to the reference potential terminal 206 via the diagnosis circuit 220 and electrically disconnects (connects) between the emitter terminal of the first semiconductor switch 214 and the reference potential terminal 206 in response to the low voltage (the high voltage) input to the gate. That is, the second semiconductor switch 216 is turned on or off in response to the second control signal input to the gate and, if turned on, provides the low voltage to the gate of the power semiconductor switch 50.

The voltage boosting circuit 230 boosts the voltage of the first control signal that turns the first semiconductor switch 214 on. FIG. 3 shows an example that the voltage boosting circuit 230 is connected to the input terminal 202 where the switching control signal is input and boosts the high voltage input from the input terminal 202. For example, the voltage boosting circuit 230 boosts the voltage of the first control signal that turns the first semiconductor switch 214 on to a higher voltage than the high voltage provided to the power semiconductor switch 50. As one example, the voltage boosting circuit 230 boosts to a high voltage equal to or higher than a voltage resulting from adding the threshold voltage of the first semiconductor switch 214 to the high voltage of the switching control signal. As one example, the voltage boosting circuit 230 supplies the signal with the boosted voltage as the power source voltage of the control circuit 240 and boosts the voltage of the first control signal being an output of the control circuit 240.

The control circuit 240 supplies the first control signal with the boosted voltage by the voltage boosting circuit 230 to the first semiconductor switch 214 in response to a condition that the switching control signal which controls switching of the power semiconductor switch 50 turns to the high voltage. The control circuit 240 supplies the first control signal to the first semiconductor switch 214 in response to the second control signal received from the NAND circuit 212. Here, as one example, the control circuit 240 receives the high voltage of the switching control signal with the boosted voltage from the voltage boosting circuit 230 as the power source voltage and outputs the first control signal of an amplitude value corresponding to the voltage value of the power source voltage. The control circuit 240 includes a first logical inversion element 242.

The first logical inversion element 242 inverts the logical value of the second control signal to output the first control signal. That is, the first logical inversion element 242 has a logical value resulting from inverting the logical value of the second control signal that the NAND circuit 212 outputs and supplies the control signal whose high voltage is boosted to be higher than the high voltage of the switching control signal to the first semiconductor switch 214 as the first control signal. For example, the first logical inversion element 242 outputs the high voltage boosted by the voltage boosting circuit 230 as the first control signal in response to a condition that the second control signal at the low voltage is input.

In this way, the control circuit 240 provides, to the gate of the first semiconductor switch 214, the high voltage voltage-boosted to a high voltage that is equal to or higher than the voltage resulting from adding the threshold voltage of the first semiconductor switch 214 to the high voltage of the switching control signal. Therefore, even if the first semiconductor switch 214 is the NMOS transistor, since the voltage-boosted high voltage is provided to the gate of the first semiconductor switch 214, the drive circuit 210 can switch the first semiconductor switch 214 to the ON state. Then, since the logical value of the first control signal is the logical value resulting from inverting the logical value of the second control signal, the second semiconductor switch 216 is turned on or turned off in response to the control signal input to the gate, and is turned off (on) if the first semiconductor switch 214 is turned on (off).

That is, similar to the device 100 described in FIG. 1, in response to a condition that the first control signal turns to the high voltage, the first semiconductor switch 214 is turned on and, also, the second semiconductor switch 216 is turned off, and the drive circuit 210 can provide the high voltage of the switching control signal to the gate of the power semiconductor switch 50. Also, in response to a condition that the first control signal turns to the low voltage, the first semiconductor switch 214 is switched off and the second semiconductor switch 216 is switched on respectively, and the drive circuit 210 can provide the low voltage of the reference potential to the gate of the power semiconductor switch 50.

When the power semiconductor switch 50 transits to the OFF state, the diode 250 makes the charges accumulated in the gate of the power semiconductor switch 50 flow toward the outside. FIG. 3 shows an example that the diode 250 is connected to the input terminal 202 at one end and is connected to the output terminal 204 at the other end. The diode 250 makes the charges flow toward the control signal generating section 10 and/or the diagnosis circuit 220 under a condition that the power semiconductor switch 50 turns to the OFF state and the gate voltage of the power semiconductor switch 50 becomes equal to or higher than the threshold voltage of the diode 250. For example, if the charges are excessively accumulated in the gate of the power semiconductor switch 50, the diode 250 makes some of the accumulated charges flow toward the outside to adjust the current rate flowing from the gate.

Similar to the diagnosis circuit 120 described in FIG. 1, the diagnosis circuit 220 diagnoses the switching control signal input to the input terminal 202 and supplies to the power semiconductor switch 50 the OFF voltage to turn the power semiconductor switch 50 OFF in response to a condition that the diagnosis result is abnormal. The description for the operation of the diagnosis circuit 220 is omitted since it has been described in FIG. 1. The diagnosis circuit 220 includes an interruption circuit 222, a third semiconductor switch 224 and a resistor 226.

The interruption circuit 222 turns the power semiconductor switch 50 OFF when the switching control signal which controls switching of the power semiconductor switch 50 is a logical value which indicates that the power semiconductor switch 50 is turned on for a period of time until the reference period elapses. That is, the interruption circuit 222, the third semiconductor switch 224 and the resistor 226 perform the similar operations to those of the interruption circuit 122, the third semiconductor switch 124 and the resistor 126 described in FIG. 1; thereby, the descriptions for them are omitted.

The device 200 according to the present embodiment above provides either an ON voltage or an OFF voltage appropriate for the power semiconductor switch 50 from the output terminal 204 to the power semiconductor switch 50 in response to the switching control signal input from the input terminal 202. Further, a more specific configurational example of the voltage boosting circuit 230 that the drive circuit 210 has and the interruption circuit 222 that the diagnosis circuit 220 has will be shown next.

Figure 4:
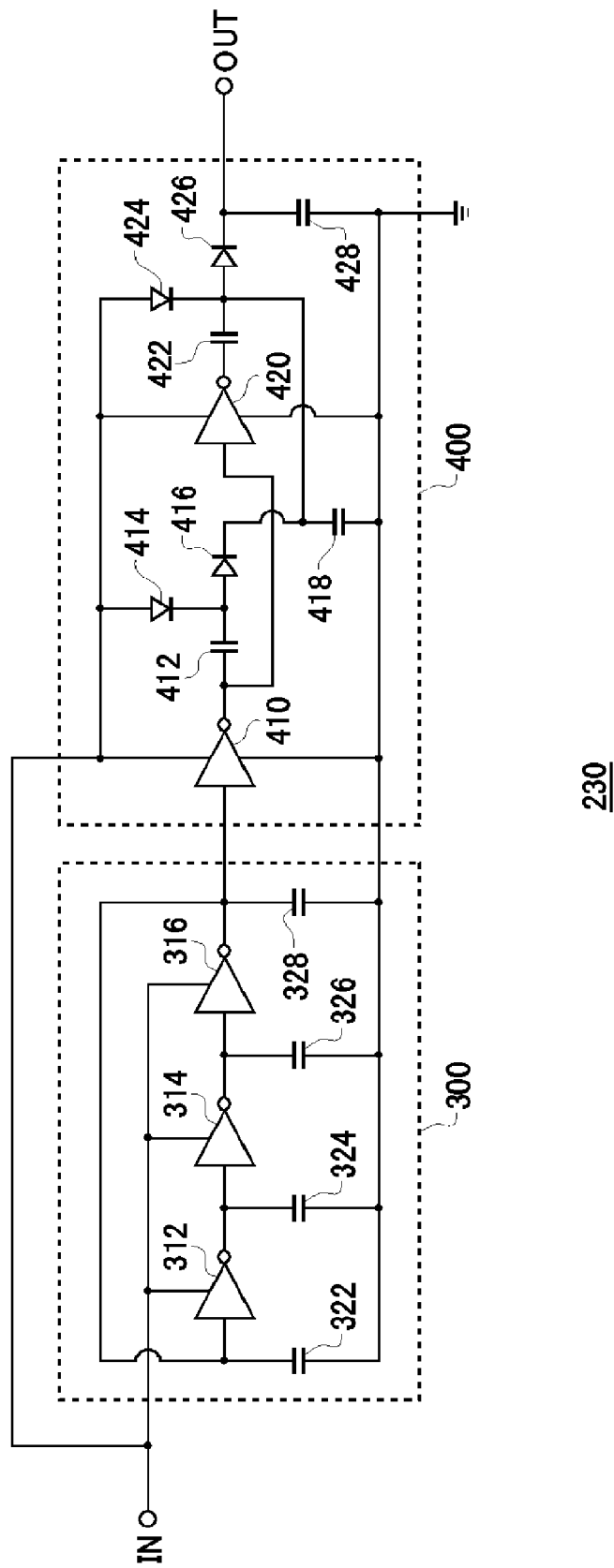
FIG. 4 shows a configurational example of a voltage boosting circuit 230 according to the present embodiment.

FIG. 4 shows a configurational example of the voltage boosting circuit 230 according to the present embodiment. The voltage boosting circuit 230 has an oscillator 300 and a charge pump circuit 400. The oscillator 300 oscillates at a predetermined frequency and outputs an oscillated frequency signal. As one example, the oscillator 300 is a ring oscillator connecting an odd number of inverter circuits in a ring shape. FIG. 4 shows an example of a ring oscillator connecting an inverter circuit 312, an inverter circuit 314 and an inverter circuit 316 in a ring shape.

In the oscillator 300 as shown in FIG. 4, if a delay period of time for each stage at the inverter circuits is set as Td and the number of the inverter circuits is set as m, an oscillation cycle T is 2m*Td. Also, as one example, the oscillator 300 oscillates approximately the same amplitude value as that of the voltage value (the high voltage) of the input signal. Further, FIG. 4 shows an example that a condenser 322, a condenser 324, condenser 326 and a condenser 328 are connected between the ring connection and the reference potential. In this way, a waveform of the frequency signal may also be adjusted to a shape near a sine wave by adding capacity components. The oscillator 300 supplies the generated frequency signal to the charge pump circuit 400.

The charge pump circuit 400 boosts the voltage of the frequency signal received from the oscillator 300, and boosts the voltage of the input signal based on the input signal. Here, an example will be described that the frequency signal received from the oscillator 300 repeats the high voltage in a first phase and the low voltage in a second phase, and the high voltage is input as the input signal. The charge pump circuit 400 has a first stage circuit including an inverter circuit 410, a condenser 412, a diode 414, a diode 416 and a condenser 418, and a second stage circuit including an inverter circuit 420, a condenser 422, a diode 424, a diode 426 and a condenser 428.

In the first phase, the inverter circuit 410 outputs the low voltage and the condenser 412 charges the high voltage input via the diode 414. Then, in the second phase, since the inverter circuit 410 outputs the high voltage, the condenser 412 discharges a sum of the charged high voltage and the high voltage input via the diode 414. In contrast to such a first stage circuit, the second stage circuit has operations in opposite phases. That is, in the second phase, the inverter circuit 420 outputs the low voltage and the condenser 422 charges the high voltage input via the diode 424. Then, in the first phase, since the inverter circuit 420 outputs the high voltage, the condenser 422 discharges a sum of the charged high voltage and the high voltage input via the diode 424.

Therefore, the charge pump circuit 400 outputs, respectively via the diode 426, the sum of the high voltages of the first stage circuit in the first phase and the sum of the high voltages of the second stage circuit in the second phase. Accordingly, the charge pump circuit 400 can output signals at a voltage twice the high voltage. It should be noted that, more correctly, since the charge pump circuit 400 boosts voltages by using two diodes (for example, the diode 414 and the diode 416), a voltage resulting from subtracting the threshold voltages of the two diodes is to be output. Therefore, as one example, if the high voltage is 5V and the threshold voltage of one diode is 0.7V, the above voltage boosting circuit 230 outputs a voltage of about 8.6V as a boosted voltage.

It should be noted that FIG. 4 merely shows one example of the voltage boosting circuit 230 and is not limited to this. For example, the oscillator 300 may also be another known circuit if it is a circuit that generates a frequency signal of a predetermined frequency. Also, the charge pump circuit 400 may also be another known circuit such as a circuit using a switch capacitor and the like, for example.

Figure 5:
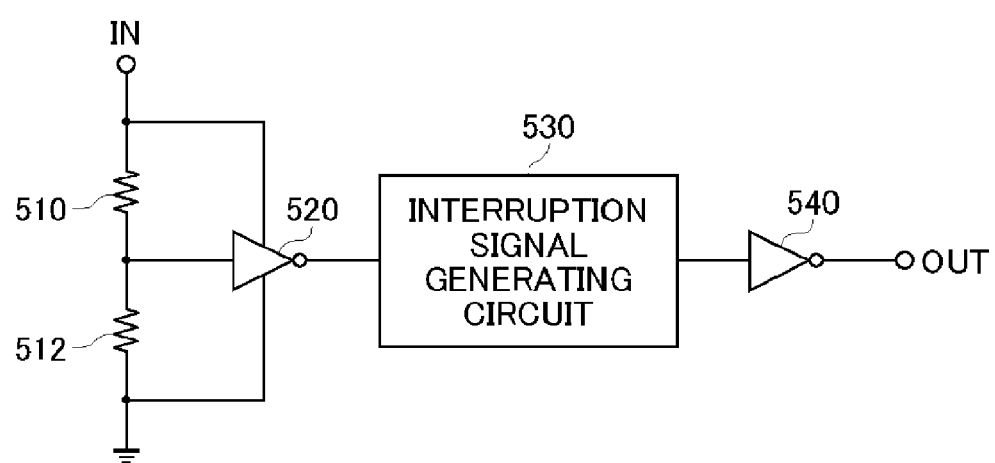
FIG. 5 shows a configurational example of an interruption circuit 222 according to the present embodiment.

FIG. 5 shows a configurational example of the interruption circuit 222 according to the present embodiment. The interruption circuit 222 has a voltage dividing resistor 510, a voltage dividing resistor 512, a second logical inversion element 520, an interruption signal generating circuit 530 and an inverter circuit 540. The voltage dividing resistor 510 and the voltage dividing resistor 512 divide voltages of voltage differences between the switching control signal and the reference voltage. Here, the reference voltage may be 0V, and in this case, the voltage dividing resistor 510 and the voltage dividing resistor 512 are to divide voltages of amplitude voltages of the switching control signal.

The second logical inversion element 520 outputs voltages resulting from logically inverting voltages that the voltage dividing resistor 510 and the voltage dividing resistor 512 output, where the switching control signal is used as the power source voltage. That is, in the second logical inversion element 520, if the switching control signal is at a low voltage, since the power source voltage becomes the low voltage, the output voltage becomes 0V (the low voltage). Also, in the second logical inversion element 520, if the switching control signal is at the high voltage, the output voltage becomes the high voltage under a condition that the voltages that the voltage dividing resistor 510 and the voltage dividing resistor 512 output are the low voltages. That is, for example, when the high voltage of the switching control signal is at a normal voltage level, resistor values of the voltage dividing resistor 510 and the voltage dividing resistor 512 adjust so as to output the divided voltages as the low voltages.

The interruption signal generating circuit 530 generates an interruption signal based on an elapsed period of time since the output of the second logical inversion element 520 turns to the high voltage. For example, the interruption signal generating circuit 530 generates the interruption signal when the elapsed period of time is beyond the predetermined period of time or the reference period of time. As one example, the interruption signal generating circuit 530 has a delay circuit.

The delay circuit outputs the interruption signal for turning the power semiconductor switch 50 off after the lapse of the reference period since the voltage that the second logical inversion element 520 outputs exceeds the threshold voltage (that is, becomes the high voltage). As one example, when the output signal of the second logical inversion element 520 and the signal that delayed the output of the second logical inversion element 520 for the reference period of time only are both at the high voltages if comparing the two signals, the delay circuit outputs the interruption signal for turning the power semiconductor switch 50 off. It should be noted that the interruption signal for turning the power semiconductor switch 50 off is at the high voltage, as one example.

The inverter circuit 540 outputs the voltage resulting from logically inverting the voltages of the output signal of the interruption signal generating circuit 530. For example, the inverter circuit 540 outputs the high voltage when the interruption signal generating circuit 530 does not generate the interruption signal (a case of the low voltage). Also, the inverter circuit 540 outputs the low voltage when the interruption signal generating circuit 530 generates the interruption signal (a case of the high voltage).

Accordingly, the interruption circuit 222 can determine whether the switching control signal is normal or not (whether or not the high voltage changes to the low voltage before the lapse of the reference period) and can output the interruption signal for turning the power semiconductor switch 50 off if abnormal. It should be noted that the configuration of the interruption circuit 222 shown in FIG. 5 is merely one example and is not limited to this. For example, the interruption circuit 222 may count the output of the oscillator 300 having the voltage boosting circuit 230 described in FIG. 4 and detect the lapse of the reference period. Also, the interruption circuit 222 may also include a circuit combining a delay element, a latching circuit and the like.

Figure 6:
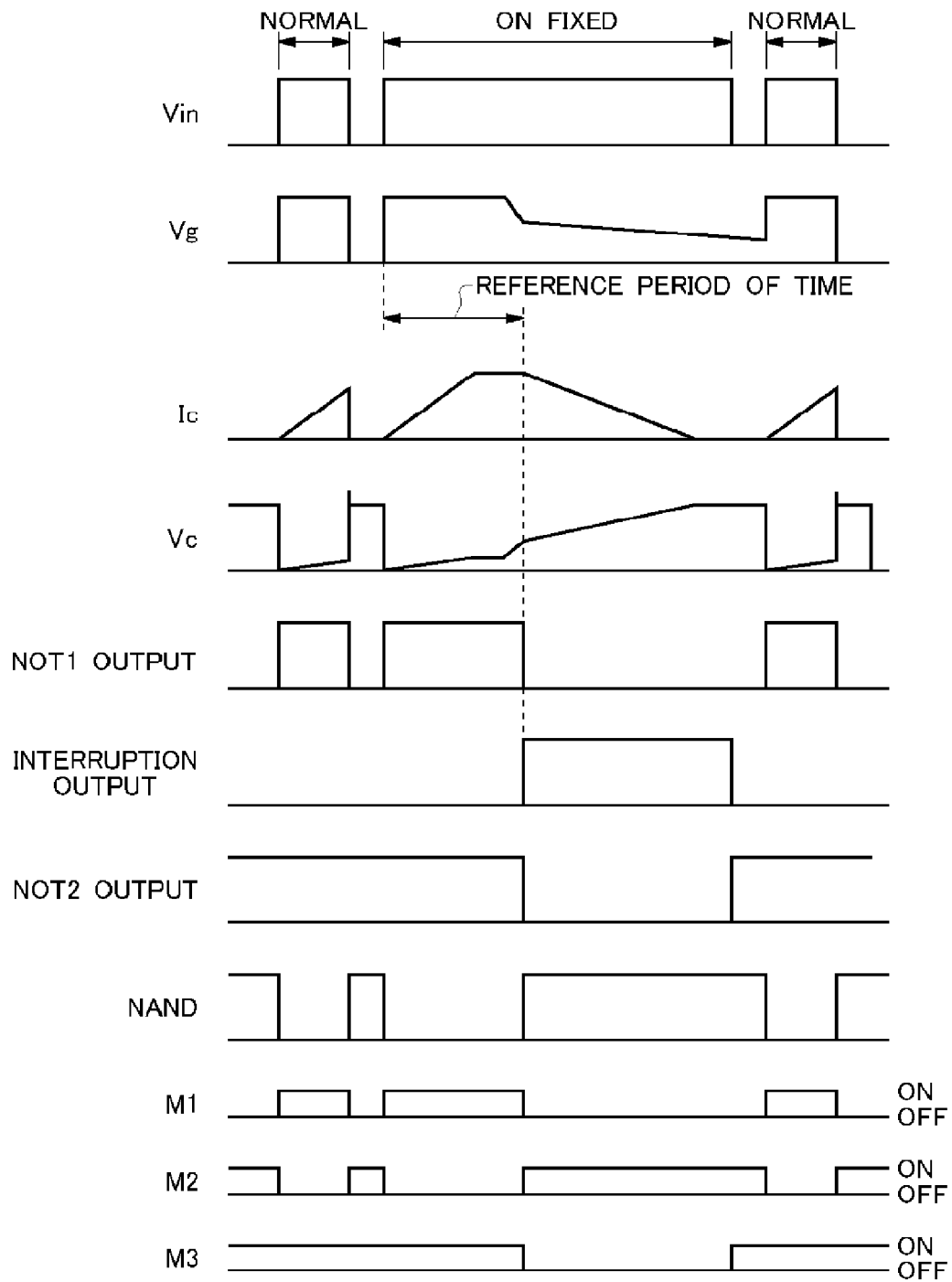
FIG. 6 shows one example of operation waveforms of the ignition device 2000 according to the present embodiment.

Operations of the ignition device 2000 described above by using FIGS. 3 to 5 will be described next. FIG. 6 shows one example of operation waveforms of the ignition device 2000 according to the present embodiment.

In FIG. 6, a horizontal axis indicates a period of time and a longitudinal axis indicates a voltage value or a current value. In FIG. 6, a waveform indicated as Vin shows the switching control signal that the control signal generating section 10 outputs. FIG. 6 shows an example that the switching control signal Vin has two normal operation waveforms indicated as "normal" and has an abnormal operation waveform indicated as "ON fixed" between the two normal operation waveforms.

Also, FIG. 6 shows one example of time waveforms of a gate voltage indicated as Vg, a collector current indicated as Ic and a collector voltage indicated as Vc of the power semiconductor switch 50 respectively. Also, FIG. 6 shows one example of time waveforms of the first control signal that the first logical inversion element 242 supplies to the gate of the first semiconductor switch 214 indicated as "NOT1 output" respectively, and, when the interruption circuit 222 includes an NOT circuit at an output stage, an input voltage of the NOT circuit indicated as "interruption output" and an output voltage of the NOT circuit indicated as "NOT2 output". Also, FIG. 6 shows one example of time waveforms of an output voltage of the NAND circuit 212 indicated as NAND, ON and OFF states of the first semiconductor switch 214 indicated as M1, ON and OFF states of the second semiconductor switch 216 indicated as M2, and ON and OFF states of the third semiconductor switch 224 indicated as M3 respectively.

When the switching control signal Vin turns to the high voltage and is in a range of normal operation, the output (NOT2 output) of the interruption circuit 222 is at the high voltage and the third semiconductor switch 224 which receives the high voltage turns to the ON state. Also, the NAND circuit 212 that receives the High voltage of the switching control signal Vin and the high voltage of the interruption circuit 222 outputs the low voltage. Also, by the low voltage of the NAND circuit 112, the output (NOT1 output) of the first logical inversion element 242 turns to the high voltage. It should be noted that the high voltage of the first logical inversion element 242 is the voltage of the first control signal by the result that the voltage boosting circuit 230 boosted the voltage of the high voltage of the switching control signal; thereby, the first semiconductor switch 114 turns to the ON state. If the first semiconductor switch 114 is turned on, the first semiconductor switch 114 provides the high voltage of the switching control signal to the gate of the power semiconductor switch 50. Also, the low voltage of the NAND circuit 112 is that of the second control signal, and the second semiconductor switch 116 turns to the OFF state.

According to the above, the ON voltage is provided to the gate of the power semiconductor switch 50 and the collector current Ic flows from the power source 40 via the primary coil 32 of the ignition coil 30. It should be noted that a time change dIc/dt of the collector current Ic is determined in response to an inductance of the primary coil 32 and the providing voltage of the power source 40 and is increased to a predetermined (or preset) current value. For example, the collector current Ic is increased approximately to several A, a dozen of A or several tens of A.

Then, if the switching control signal Vin turns to the low voltage, the NAND circuit 212 outputs the high voltage. By the high voltage of the NAND circuit 212, the output (NOT1 output) of the first logical inversion element 242 turns to the low voltage and the first semiconductor switch 214 turns to the OFF state. Also, the second semiconductor switch 216 turns to the ON state. That is, since the OFF voltage is provided to the gate of the power semiconductor switch 50 and the charges accumulated in the gate of the power semiconductor switch 50 flow to the reference potential via the second semiconductor switch 216 and the third semiconductor switch 224, the collector current Ic is drastically decreased. It should be noted that if the charges accumulated in the gate of the power semiconductor switch 50 are excessive, the charges may also be discharged via the diode 250.

Due to the drastic decrease of the collector current Ic, the both-end voltage of the primary coil 32 is drastically increased by the self-induced electromotive force and causes the induced electromotive force of about several tens of kV to be generated at the both-end voltage of the secondary coil 34. The ignition device 2000 discharges the ignition plug 20 to ignite the combustion gas by providing such a voltage of the secondary coil 34 to the ignition plug 20. As the above, the device 200 according to the present embodiment can provide an appropriate ON voltage and OFF voltage to the power semiconductor switch 50 in response to the switching control signal input from the input terminal 202, and the ignition device 2000 can execute the igniting operation of the ignition plug 20 by the switching control signal diagnosed with the normal operation.

On the other hand, when the switching control signal Vin continues being at the high voltage without being switched to the low voltage, the ON voltage is continuously provided to the gate of the power semiconductor switch 50 and the collector current Ic is further increased. Depending on the power semiconductor switch 50, the collector current Ic is increased to a saturated region in some cases. The operation waveforms in FIG. 6 show an example that the saturation occurred. Then, if the high voltage of the switching control signal Vin continues for a period of time exceeding the reference period of time, the interruption circuit 222 diagnoses that the switching control signal is abnormal and outputs the low voltage (the NOT2 output).

Accordingly, the NAND circuit 212 that receives the high voltage of the switching control signal Vin and the low voltage of the interruption circuit 222 outputs the high voltage. By the high voltage of the NAND circuit 212, the first semiconductor switch 214 turns to the OFF state and the second semiconductor switch 216 turns to the ON state. Also, the third semiconductor switch 224 that receives the low voltage of the interruption circuit 222 turns to the OFF state. That is, since the OFF voltage is provided to the gate of the power semiconductor switch 50 and the charges accumulated in the gate of the power semiconductor switch 50 flow to the reference potential via the resistor 226, the collector current Ic is gradually decreased. It should be noted that if the charges accumulated in the gate of the power semiconductor switch 50 are excessive, the charges may also be discharged via the diode 250.

Therefore, when the switching control signal is diagnosed with the abnormality, the device 200 according to the present embodiment can gradually decrease the collector current Ic to prevent the ignition plug 20 from discharging even if the collector current Ic is increased to the extent of saturation. That is, the device 200 can provide an appropriate ON voltage and OFF voltage to the power semiconductor switch 50 in response to the switching control signal input from the input terminal 202, and the ignition device 2000 can stop the igniting operation of the ignition plug 20 by the switching control signal diagnosed with the abnormal operation.

The example that the device 200 according to the present embodiment above is a separate device from the power semiconductor switch 50 has described. Alternatively, the device 200 may also further comprise the power semiconductor switch 50. The following shows a one-chip device in the device 200, the one-chip device in which the power semiconductor switch 50 is integrated.

Figure 7:
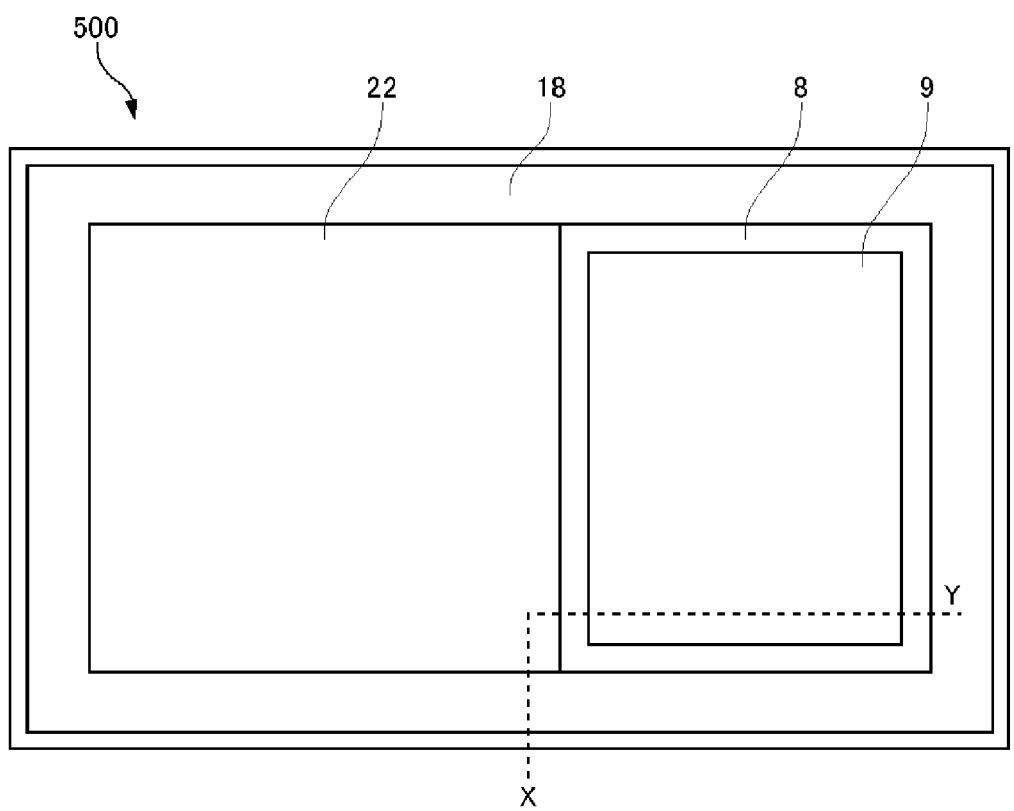
FIG. 7 shows a configurational example of a one-chip device 500 according to the present embodiment.
Figure 8:
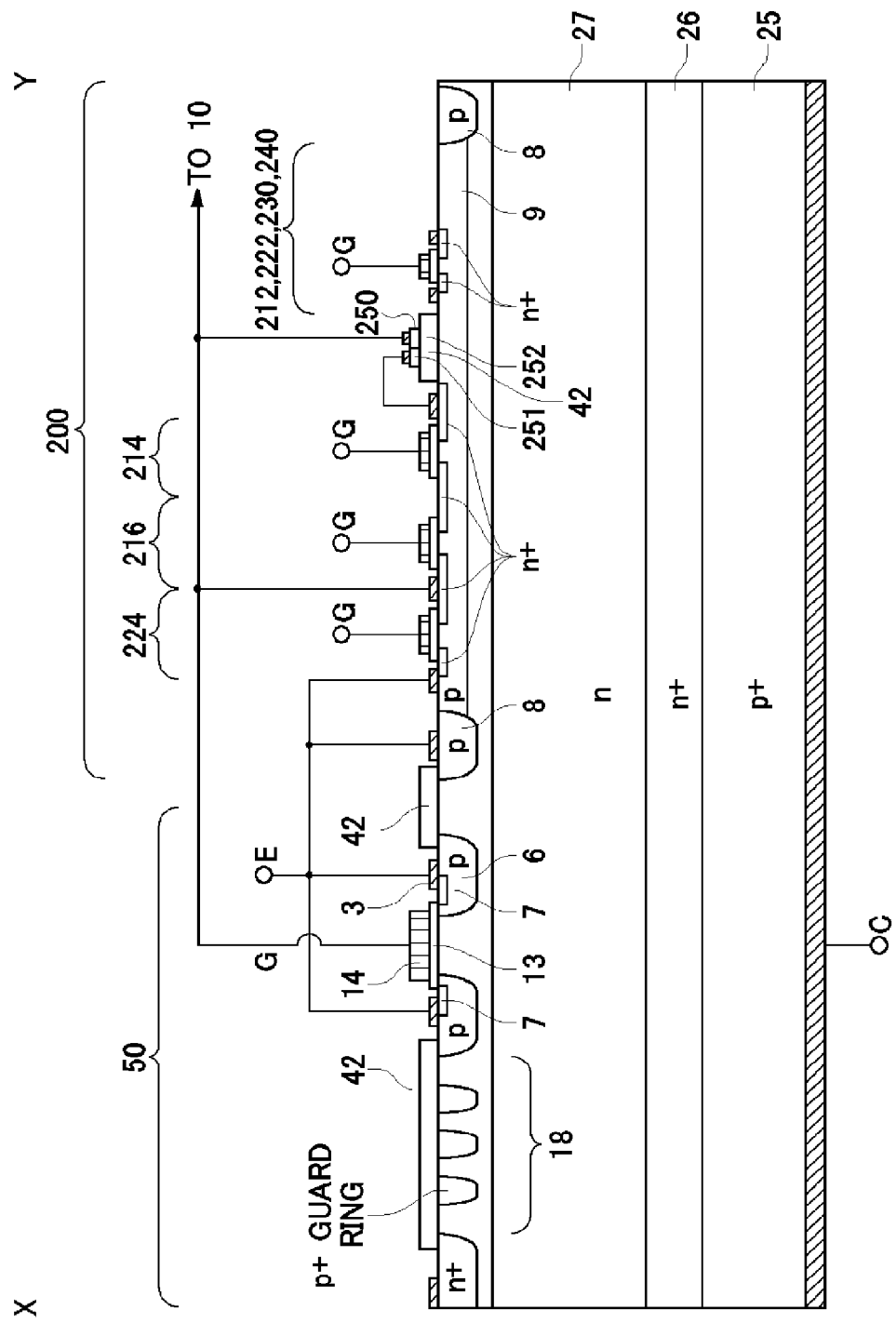
FIG. 8 shows one example of a cross-sectional view of the one-chip device 500 according to the present embodiment.

FIG. 7 and FIG. 8 show a configurational example of the one-chip device 500 according to the present embodiment. FIG. 7 shows a plane view and FIG. 8 shows one example of a cross-sectional view from an X-Y line of FIG. 7. FIG. 7 and FIG. 8 describe an example that the power semiconductor switch 50 is IGBT of N channel type and the transistors configuring the device 200 are all NMOS transistors.

The power semiconductor switch 50 and the device 200 are formed within a semiconductor substrate where an $n^+$ buffer layer 26 and an n base layer 27 are sequentially formed epitaxially growing on a $p^+$ substrate 25. A withstand voltage region 18 is arranged in a periphery surrounding an active region 22 where a main current of the power semiconductor switch 50 flows. The withstand voltage region 18 is arranged surrounding the active region 22 and the device 200. The active region 22 includes a p base region 6 formed in a front surface layer of the n base layer 27, an $n^+$ emitter region 7 formed in a front surface layer of the p base region 6, an emitter electrode 3 connecting the p base region 6 and the $n^+$ emitter region 7, a gate-insulating film 13 formed on a front surface of the p base region 6 between the $n^+$ emitter region 7 and the n base layer 27, and a gate electrode 14 formed on the gate-insulating film 13.

The device 200 comprises a p region 9 formed in the front surface layer of the n base layer 27 and a p region 8 surrounding the p region 9 and conductively connected to the emitter electrode 3. The first semiconductor switch 214, the second semiconductor switch 216 and the third semiconductor switch 224 which are configured with all NMOS transistors are arranged in a front surface layer of the p region 9. Furthermore, the transistors which configure the NAND circuit 212, the interruption circuit 222, the voltage boosting circuit 230 and the control circuit 240 are all NMOS transistors (only one NMOS is described in the drawing). The diode 250 is formed of polysilicon which dopes impurities on an insulating film 42 formed on the p region 9. An anode electrode and a cathode electrode are formed respectively on a $p^+$ region 251 and an $n^+$ region 252. Although not shown in the drawing, a capacitor or resistor element configuring each circuit is also configured with polysilicon and the like on an insulating film formed on the p region 9.

In this way, the device 200 is formed by a convenient manufacturing process and at a low cost and can function as a one-chip igniter.

As the above, the example that in the described device 200 according to the present embodiment any of the first semiconductor switch 214, the second semiconductor switch 216 and the third semiconductor switch 224 is the NMOS transistor has been described. It should be noted that, alternatively, in the device 200, any of the first semiconductor switch 214, the second semiconductor switch 216 and the third semiconductor switch 224 may also be the PMOS transistor, and even if in this case, the device 200 operates in principle.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, the specification, or the diagrams can be performed in any order as long as the order is not indicated by "prior to," "before," or the like and as long as the output from a previous process is not used in a later process. Even if the process flow is described using phrases such as "first" or "next" in the claims, the specification, or the diagrams, it does not necessarily mean that the process must be performed in this order.

What is claimed is:

1. A device to switch a power semiconductor switch, comprising:
   a first semiconductor switch which is turned on or turned off in response to a first control signal input to a gate and, if turned on, provides a high voltage to a gate of the power semiconductor switch;

a voltage boosting circuit which boosts a voltage of the first control signal that turns the first semiconductor switch on; and a control circuit which supplies the first control signal with the boosted voltage by the voltage boosting circuit to the first semiconductor switch in response to a condition that a switching control signal which controls switching of the power semiconductor switch turns to the high voltage, wherein the first semiconductor switch, if turned on, provides the high voltage of the switching control signal to the gate of the power semiconductor switch, the voltage boosting circuit is connected to an input terminal in which the switching control signal is input and boosts the high voltage which is input from the input terminal, and the control circuit provides the high voltage from the input terminal, the high voltage boosted by the voltage boosting circuit, to the first semiconductor switch as the first control signal with the boosted voltage in response to a condition that the switching control signal turns to the high voltage.

2. The device according to claim 1, wherein the voltage boosting circuit boosts the voltage of the first control signal which turns the first semiconductor switch on to a higher voltage than the high voltage.

3. The device according to claim 1, further comprising:
a second semiconductor switch which is turned on or turned off in response to a second control signal input to a gate and if turned on, provides a low voltage to the gate of the power semiconductor switch, wherein
any of the first semiconductor switch and the second semiconductor switch is a PMOS semiconductor switch or any of the first semiconductor switch and the second semiconductor switch is an NMOS semiconductor switch.

4. The device according to claim 3, further comprising:
a first logical inversion element which inverts a logical value of the second control signal and outputs the first control signal, wherein
the first logical inversion element outputs the first control signal with the boosted voltage by the voltage boosting circuit in response to a condition that the second control signal which is at the low voltage is input.

5. The device according to claim 1, wherein the device further comprises the power semiconductor switch.

6. The device according to claim 5, wherein the power semiconductor switch is an insulated gate bipolar transistor (IGBT), and
the first semiconductor switch is an NMOS semiconductor switch.

7. The device according to claim 1, further comprising:
an interruption circuit which turns the power semiconductor switch off if a switching control signal which controls switching of the power semiconductor switch is a logical value showing that the power semiconductor switch is turned on until a reference period elapses.

8. The device according to claim 7, wherein the voltage boosting circuit has an oscillator and a charge pump, and
the interruption circuit counts an output of the oscillator to detect a lapse of the reference period.

9. The device according to claim 7, wherein the interruption circuit has:
a voltage dividing resistor which divides a voltage of the switching control signal and a reference voltage;
a second logical inversion element which outputs a voltage resulting from logically inverting a voltage that is output by the voltage dividing resistor wherein the switching control signal is used as a power source voltage; and
a delay circuit which outputs an interruption signal for turning the power semiconductor switch off after a lapse of the reference period since a voltage output by the second logical inversion element exceeds a threshold voltage.

10. A device to switch a power semiconductor switch, comprising:
a first semiconductor switch which is turned on or turned off in response to a first control signal input to a gate and, if turned on, provides a high voltage to a gate of the power semiconductor switch;
a voltage boosting circuit which boosts a voltage of the first control signal that turns the first semiconductor switch on; and
an interruption circuit which turns the power semiconductor switch off if a switching control signal which controls switching of the power semiconductor switch is a logical value showing that the power semiconductor switch is turned on until a reference period elapses.

11. The device according to claim 10, wherein the voltage boosting circuit has an oscillator and a charge pump, and
the interruption circuit counts an output of the oscillator to detect a lapse of the reference period.

12. The device according to claim 10, wherein the interruption circuit has:
a voltage dividing resistor which divides a voltage of the switching control signal and a reference voltage;
a second logical inversion element which outputs a voltage resulting from logically inverting a voltage that is output by the voltage dividing resistor wherein the switching control signal is used as a power source voltage; and
a delay circuit which outputs an interruption signal for turning the power semiconductor switch off after a lapse of the reference period since a voltage output by the second logical inversion element exceeds a threshold voltage.

13. The device according to claim 10, wherein the voltage boosting circuit boosts the voltage of the first control signal which turns the first semiconductor switch on to a higher voltage than the high voltage.

14. The device according to claim 10, further comprising:
a control circuit which supplies the first control signal with the boosted voltage by the voltage boosting circuit to the first semiconductor switch in response to a condition that a switching control signal which controls switching of the power semiconductor switch turns to the high voltage, wherein
the first semiconductor switch, if turned on, provides the high voltage of the switching control signal to the gate of the power semiconductor switch.

15. The device according to claim 10, further comprising:
a second semiconductor switch which is turned on or turned off in response to a second control signal input to a gate and if turned on, provides a low voltage to the gate of the power semiconductor switch, wherein any of the first semiconductor switch and the second semiconductor switch is a PMOS semiconductor switch or any of the first semiconductor switch and the second semiconductor switch is an NMOS semiconductor switch.

16. The device according to claim 15, further comprising:
a first logical inversion element which inverts a logical value of the second control signal and outputs the first control signal, wherein
the first logical inversion element outputs the first control signal with the boosted voltage by the voltage boosting circuit in response to a condition that the second control signal which is at the low voltage is input.

17. The device according to claim 10, wherein
the device further comprises the power semiconductor switch.

18. The device according to claim 17, wherein
the power semiconductor switch is an insulated gate bipolar transistor (IGBT), and
the first semiconductor switch is an NMOS semiconductor switch.

\* \* \* \* \*